(12) United States Patent
Ma

(10) Patent No.: US 9,680,456 B1
(45) Date of Patent: Jun. 13, 2017

(54) DIGITAL-TO-ANALOG CONVERTER AND HIGH-VOLTAGE TOLERANCE CIRCUIT

(71) Applicant: VIA Alliance Semiconductor Co., Ltd., Shanghai (CN)

(72) Inventor: Zhen Ma, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/969,459

(22) Filed: Dec. 15, 2015

(30) Foreign Application Priority Data

Dec. 4, 2015 (CN) .......................... 2015 1 0890854

(51) Int. Cl.
*H03K 5/08* (2006.01)
*H03M 1/66* (2006.01)

(52) U.S. Cl.
CPC ............... *H03K 5/08* (2013.01); *H03M 1/66* (2013.01)

(58) Field of Classification Search
CPC .................................. H03K 5/08; H03M 1/66
USPC ........................... 327/530–546; 323/312–317
See application file for complete search history.

(56) References Cited

U.S. PATENT DOCUMENTS

| | | | |
|---|---|---|---|
| 5,703,588 A | 12/1997 | Rivoir et al. | |
| 6,316,926 B1 * | 11/2001 | Savo | H02M 1/36 323/282 |
| 6,507,241 B1 * | 1/2003 | Ritter | H03F 3/45941 327/307 |
| 6,590,456 B2 * | 7/2003 | Yang | H03F 1/223 327/328 |
| 6,718,275 B2 * | 4/2004 | Nagase | G01D 3/022 327/509 |
| 8,310,849 B2 * | 11/2012 | Lin | H02M 3/156 323/282 |
| 8,432,144 B2 * | 4/2013 | Notani | G05F 1/575 323/280 |
| 2005/0200400 A1 * | 9/2005 | Takeuchi | G05F 3/242 327/536 |
| 2006/0103453 A1 * | 5/2006 | Pisasale | G05F 3/262 327/541 |
| 2008/0238482 A1 * | 10/2008 | Tian | H03K 19/00384 326/82 |
| 2009/0243663 A1 * | 10/2009 | Chalamala | H03F 3/45085 327/67 |
| 2014/0333348 A1 * | 11/2014 | Cheng | H03F 3/345 327/103 |
| 2015/0187335 A1 * | 7/2015 | Sugiyama | G09G 3/32 345/208 |

OTHER PUBLICATIONS

Chinese language office action dated Nov. 21, 2016, issued in application No. TW 104141872.

* cited by examiner

*Primary Examiner* — Brandon S Cole
(74) *Attorney, Agent, or Firm* — McClure, Qualey & Rodack, LLP

(57) ABSTRACT

A digital-to-analog converter (DAC) and a high-voltage tolerance circuit are provided. The DAC includes a high-voltage tolerance circuit. The high-voltage tolerance circuit is configured to generate a reference voltage, and select the reference voltage or a first power-source voltage to control the node voltage of each branch of an operational amplifier circuit of the high-voltage tolerance circuit according the logical signal level of an input signal.

20 Claims, 6 Drawing Sheets

DIGITAL-TO-ANALOG CONVERTER AND HIGH-VOLTAGE TOLERANCE CIRCUIT

CROSS REFERENCE TO RELATED APPLICATIONS

This Application claims priority of China Patent Application No. 201510890854.6 filed on Dec. 4, 2015, the entirety of which is incorporated by reference herein.

BACKGROUND OF THE INVENTION

Field of the Invention

The invention generally relates to digital-to-analog converters (DAC), and more particularly, to methods of configuring a high-voltage tolerance circuit in the DAC to make sure that the DAC-for-28 nanometer (nm) manufacturing process can operate normally with a high-power source voltage.

Description of the Related Art

A television (TV)/Cathode Ray Tube (CRT) video digital-to-analog converter (DAC) is usually realized by the current-steering DAC structure, where it can output two kinds of analog signals: one for the TV mode and one for the CRT mode. The full-scale voltages for the TV mode and the CRT mode are 1.33 V and 0.69 V, respectively.

In 45-nanometer (nm) manufacturing process, the transistor can support a power-source voltage of up to 2.3V. Therefore, when the output voltage for the full-scale voltage of the TV mode is 1.33V, the traditional DAC can achieve a higher linearity. However, as the size of the manufacturing process technology is reduced to 28 nanometers (nm), the voltage endurance of the transistor is reduced to 1.8V. In these cases, when the traditional DAC is utilized to work with a full-scale voltage (or one that is approximate to that of the full-scale voltage) of the TV mode, the DAC cannot achieve the linearity required by the product standards, and as a result, the applications of the DAC will be limited.

BRIEF SUMMARY OF THE INVENTION

A digital-to-analog converter and a high-voltage tolerance circuit are provided to overcome the aforementioned problems. The high-voltage tolerance circuit of the invention makes sure that the DAC-for-28 nanometer (nm) manufacturing process can operate normally with a high-power source voltage.

An embodiment of the invention provides a digital-to-analog converter. The digital-to-analog converter includes a high-voltage tolerance circuit. The high-voltage tolerance circuit is configured to generate a reference voltage and select the reference voltage or a first power-source voltage to control a node voltage of each branch of an operational amplifier circuit of the high-voltage tolerance circuit according a logical signal level of an input signal.

An embodiment of the invention provides a high-voltage tolerance circuit. The high-voltage tolerance circuit is included in a digital-to-analog converter. The high-voltage tolerance circuit includes a clamping reference voltage generating circuit and an operational amplifier circuit. The clamping reference voltage generating circuit is configured to generate a reference voltage. The operational amplifier circuit includes a first clamping circuit, and selects the reference voltage or a first power-source voltage to control a node voltage of each branch of the operational amplifier circuit according a logical signal level of an input signal by the first clamping circuit.

Other aspects and features of the invention will become apparent to those with ordinary skill in the art upon review of the following descriptions of specific embodiments of communication transmission methods and systems.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
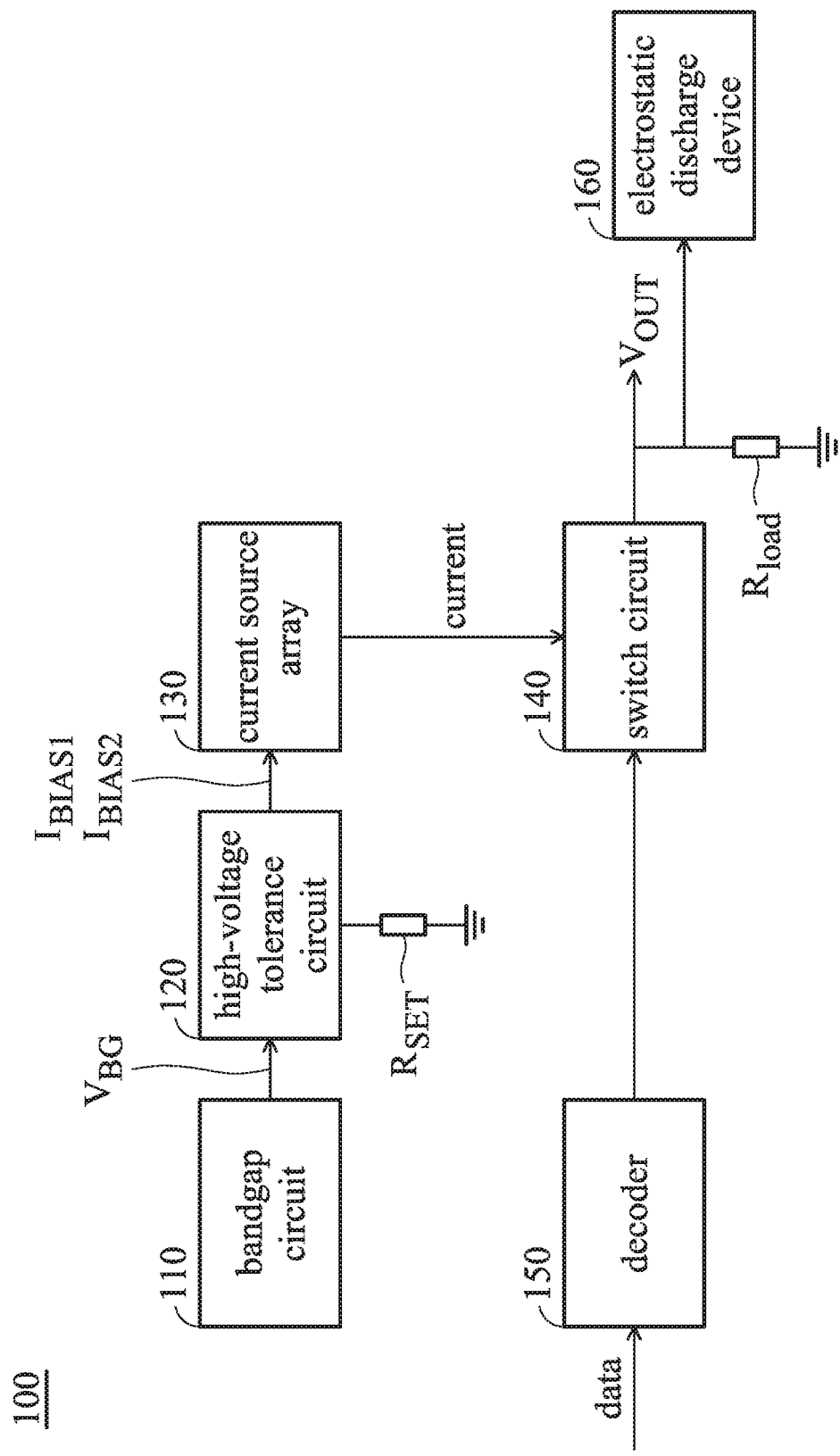
FIG. 1 is a block diagram of the digital-to-analog Converter (DAC) 100 according to an embodiment of the invention.

FIG. 1 is a block diagram of the digital-to-analog Converter (DAC) 100 according to an embodiment of the invention. The DAC 100 may be applied to 28-nanometer (nm) manufacturing process technology. As shown in FIG. 1, the DAC 100 includes a bandgap circuit 110, a high-voltage tolerance circuit 120, a current source array 130, a switch circuit 140, a decoder 150, and an electrostatic discharge (ESD) device 160. Note that, in order to clarify the concept of the invention, FIG. 1 is a simplified block diagram in which only the elements relevant to the invention are shown. However, the invention should not be limited to what is shown in FIG. 1.

In an embodiment of the invention, the high-voltage tolerance circuit 120 which replaces the traditional current source circuit is configured in the DAC 100. This ensures that the DAC 100 can work with the 1.8V-2.5V power-source voltage to achieve a higher linearity when the DAC 100 is in the TV mode. The details of the high-voltage tolerance circuit 120 are discussed below. Note that, because other elements of the DAC 100 are known in the art, a detailed description of these elements is not provided.

Figure 2:
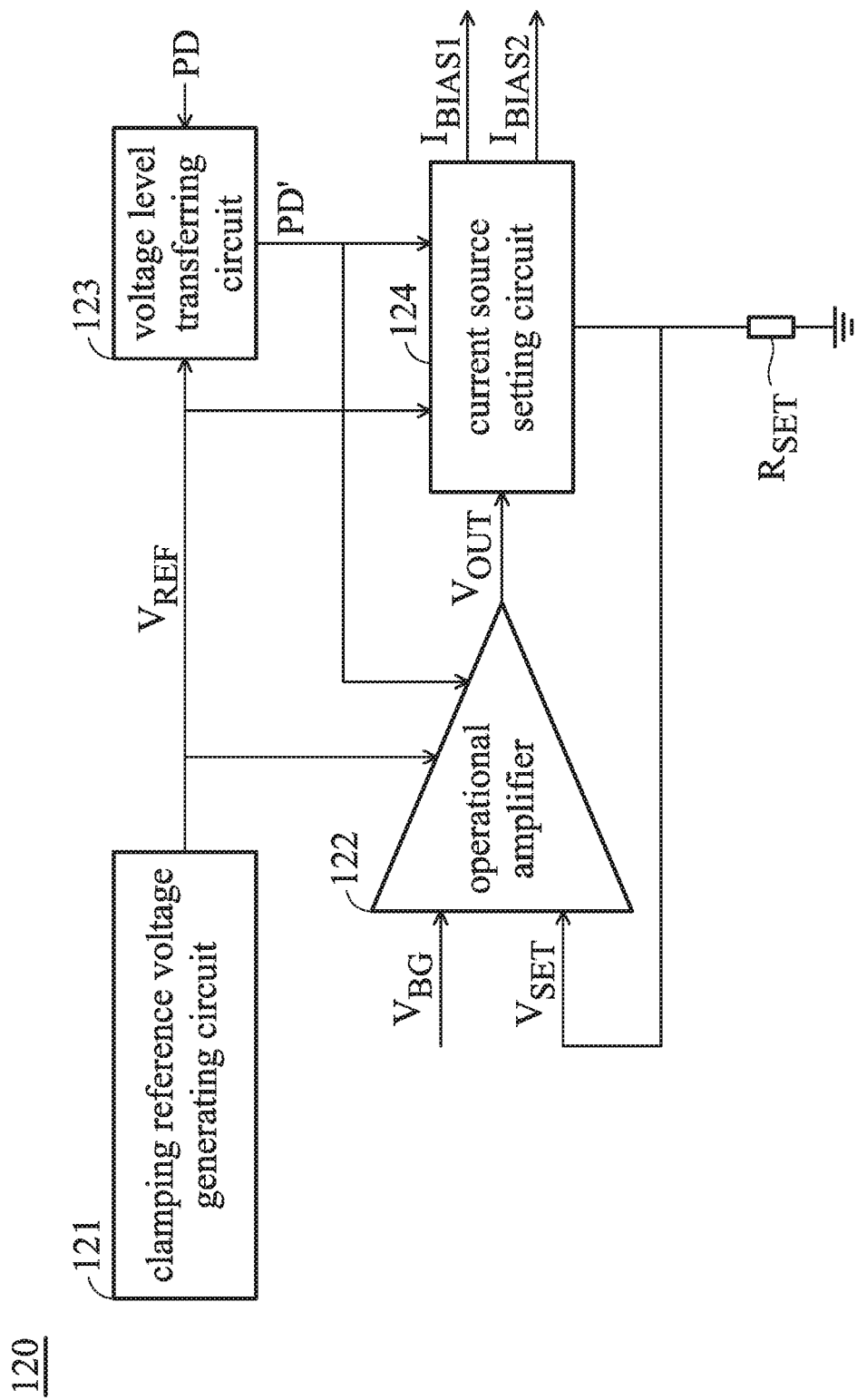
FIG. 2 is a block diagram of the high-voltage tolerance circuit 120 according to an embodiment of the invention.

FIG. 2 is a block diagram of the high-voltage tolerance circuit 120 according to an embodiment of the invention. As shown in FIG.2, the high-voltage tolerance circuit 120 includes a clamping reference voltage generating circuit 121, an operational amplifier circuit 122, a voltage level transferring circuit 123 and a current source setting circuit 124. Note that, in order to clarify the concept of the invention, FIG. 2 is a simplified block diagram in which only the elements relevant to the invention are shown. However, the invention should not be limited to what is shown in FIG. 2.

In an embodiment of the invention, the clamping reference voltage generating circuit 121 is configured to generate a reference voltage $V_{REF}$ which is directly proportional to power-source voltage (e.g. a power-source voltage VDDA). Details of the clamping reference voltage generating circuit 121 are illustrated in FIG. 3 and are described below.

Figure 3:
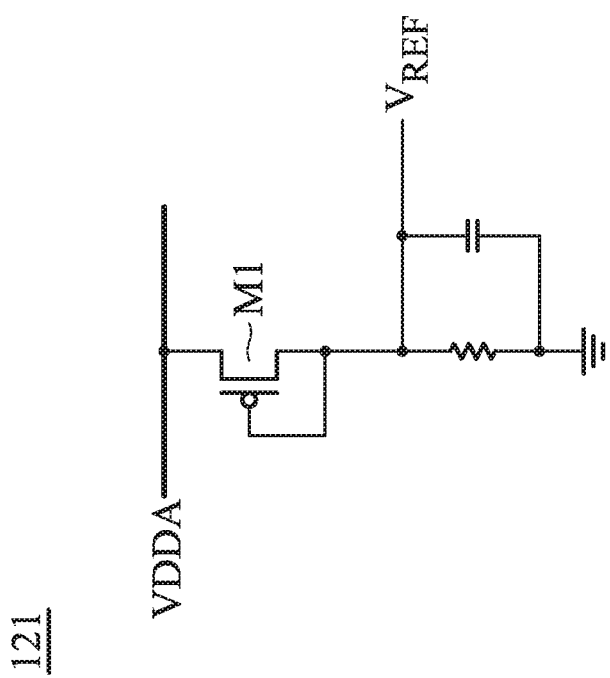
FIG. 3 is a schematic diagram of the clamping reference voltage generating circuit 121 according to an embodiment of the invention.

FIG. 3 is a schematic diagram of the clamping reference voltage generating circuit 121 according to an embodiment of the invention. As shown in FIG. 3, the clamping reference voltage generating circuit 121 includes a first transistor M1. The clamping reference voltage generating circuit 121 may generate the reference voltage $V_{REF}$ according to the power-source voltage VDDA and the gate-to-source voltage ($V_{GS}$) of the first transistor M1. Specifically, the reference voltage $V_{REF}$ is defined as $V_{REF}=VDDA-V_{GS}$, and the reference voltage $V_{REF}$ is increased along with the increased power-source voltage VDDA. In an embodiment of the invention, the power-source voltage VDDA is a high-power source voltage, its voltage value is greater than or equal to the normal power-source voltage VDDB (1.8V), e.g. 1.8V-2.5V. In an embodiment of the invention, the first transistor M1 is a P-channel Metal-Oxide-Semiconductor Field-Effect Transistor (PMOSFET). After the clamping reference voltage generating circuit 121 generates the reference voltage $V_{REF}$, the clamping reference voltage generating circuit 121 will provide the reference voltage $V_{REF}$ to the operational amplifier circuit 122, the voltage level transferring circuit 123, and the current source setting circuit 124.

In an embodiment of the invention, the operational amplifier circuit 122 includes a first clamping circuit 125. The operational amplifier circuit 122 chooses to adopt the reference voltage $V_{REF}$ or the normal power-source voltage VDDB to control the node voltages of each branch of the operational amplifier circuit 122 according to the logical level of an input signal (e.g. a power down (PD) signal) of the first clamping circuit 125. Details of the operational amplifier circuit 122 are illustrated in FIG. 4 and are described below.

Figure 4:
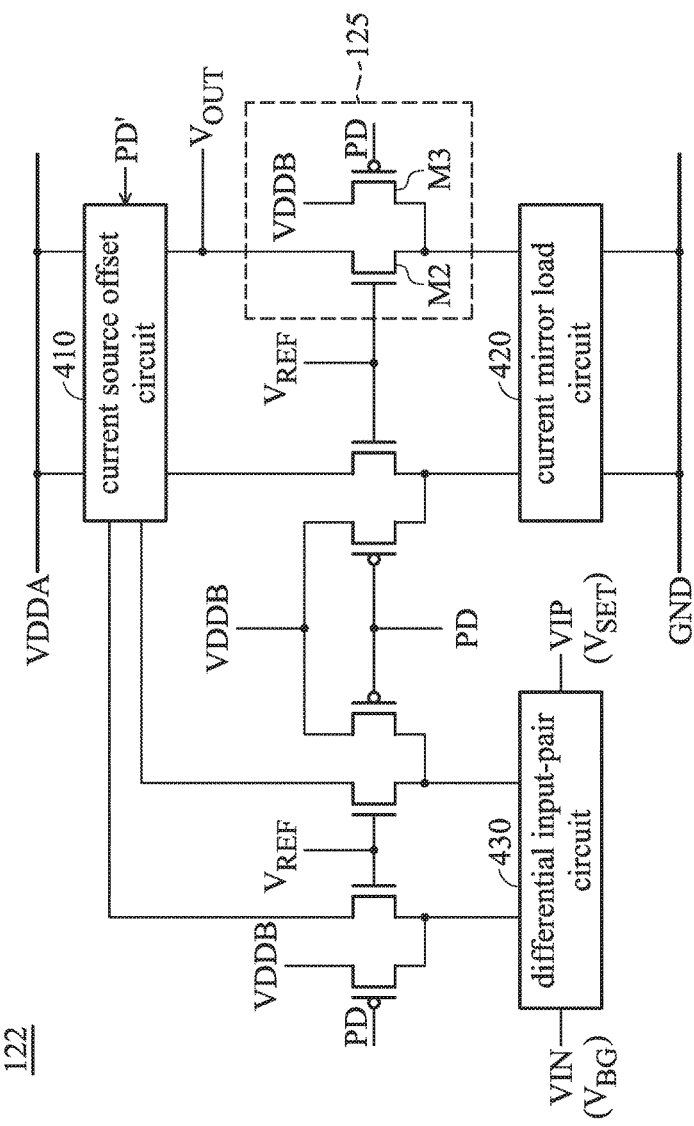
FIG. 4 is a schematic diagram of the operational amplifier circuit 122 according to an embodiment of the invention.

FIG. 4 is a schematic diagram of the operational amplifier circuit 122 according to an embodiment of the invention. The operational amplifier circuit 122 has two input ends to receive the signals VIN and VIP. In an embodiment of the invention, the signal VIN is regarded as the bandgap voltage $V_{BG}$ generated by the bandgap circuit 110 in FIG. 1, and the signal VIP is regarded as the voltage $V_{SET}$ corresponding to the resistor $R_{SET}$ in FIG. 2. The operational amplifier circuit 122 generates a signal $V_{OUT}$ according to the signals VIN and VIP. In an embodiment of the invention, the signal $V_{OUT}$ is regarded as the first offset voltage $I_{BIAS1}$ shown in FIG. 2 and FIG. 6. As shown in FIG. 4, the first clamping circuit 125 includes a second transistor M2 and a third transistor M3, where the transistor M2 is a N-channel Metal-Oxide-Semiconductor Field-Effect Transistor (NMOSFET), and the transistor M3 is a P-channel Metal-Oxide-Semiconductor Field-Effect Transistor (PMOSFET).

When the high-voltage tolerance circuit 120 works in a normal working state, the operational amplifier circuit 122 may turn on the transistor M2 and clamp the source electric potential of the transistor M2 to a first voltage to ensure that other transistors (e.g. the transistors of the current source offset circuit 410 and current mirror load circuit 420) in each branch can work within a safe voltage range to avoid the breakdown of the transistors caused by the higher voltage. In an embodiment of the invention, the first voltage is defined as the value of the difference between the reference voltage $V_{REF}$ and the gate-to-source voltage ($V_{GS}$) of the second transistor M2 (i.e. $V_{REF}-V_{GS}$). In FIG. 4, the signal PD' which is received by the current source offset circuit 410 is the signal which has been transferred by the voltage level transferring circuit 123 (details of the operation will be discussed in FIG.5).

When the high-voltage tolerance circuit 120 works in a power down state, the operational amplifier circuit 122 may turn on the transistor M3 and turns off the transistor M2, and increase the node voltages of each branch of the of the operational amplifier circuit 122 to the normal power-source voltage VDDB to avoid the breakdown of all transistors of the operational amplifier circuit 122.

In an embodiment of the invention, the voltage level transferring circuit 123 is configured to transfer a logical signal level of an input signal. The details of the voltage level transferring circuit 123 will be illustrated in FIG. 5.

Figure 5:
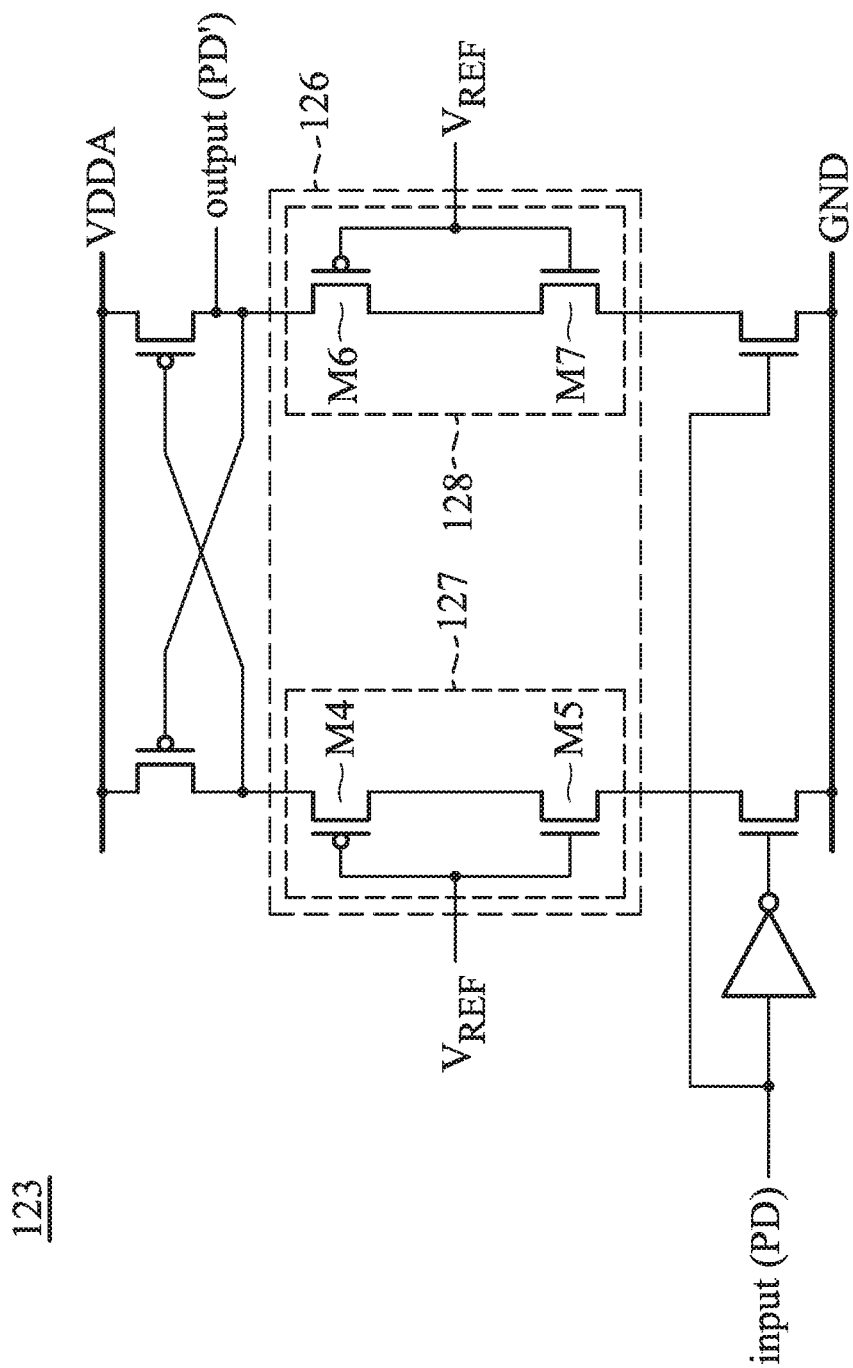
FIG. 5 is a schematic diagram of the voltage level transferring circuit 123 according to an embodiment of the invention.

FIG. 5 is a schematic diagram of the voltage level transferring circuit 123 according to an embodiment of the invention. As shown in FIG. 5, the voltage level transferring circuit 123 includes a second clamping circuit 126. The second clamping circuit 126 includes a first sub-clamping circuit 127 and a second sub-clamping circuit 128. The first sub-clamping circuit 127 includes a fourth transistor M4 and a fifth transistor M5. The second sub-clamping circuit 128 includes a sixth transistor M6 and a seventh transistor M7. That is to say, the fourth transistor M4 is coupled to the fifth transistor M5, and the sixth transistor M6 is coupled to the seventh transistor M7. In an embodiment of the invention, the fourth transistor M4 and the sixth transistor M6 are P-channel Metal-Oxide-Semiconductor Field-Effect Transistors (PMOSFETs) and the fifth transistor M5 and the seventh transistor M7 are N-channel Metal-Oxide-Semiconductor Field-Effect Transistors (PMOSFETs).

The voltage level transferring circuit 123 may transfer the logical signal level of a input signal (e.g. a power down signal) through the second clamping circuit 126 to ensure that the high-voltage tolerance circuit 120 can work in the high-power source voltage, and maintain a safe voltage environment (i.e. the breakdown of the transistor will not occur). In an embodiment of the invention, the voltage level transferring circuit 123 may transfer the high logical signal level of the input signal from the normal-power source voltage VDDB to higher-power source voltage VDDA by the second clamping circuit 126, and transfer the low logical signal level of the input signal from GND to the reference voltage $V_{REF}$ which is generated by the clamping reference voltage generating circuit 121. In the embodiment of the invention, the voltage level transferring circuit 123 transfers the power down signal PD to the output signal PD', and the output signal PD' is provided to the current source offset circuit 410 of FIG. 4 and to the current source setting circuit 124.

In an embodiment of the invention, the current source setting circuit 124 is configured to control the DAC 100 to work in a TV mode or a Cathode Ray Tube (CRT) mode according to a mode selecting signal. The details of the current source setting circuit 124 are illustrated in FIG. 6.

Figure 6:
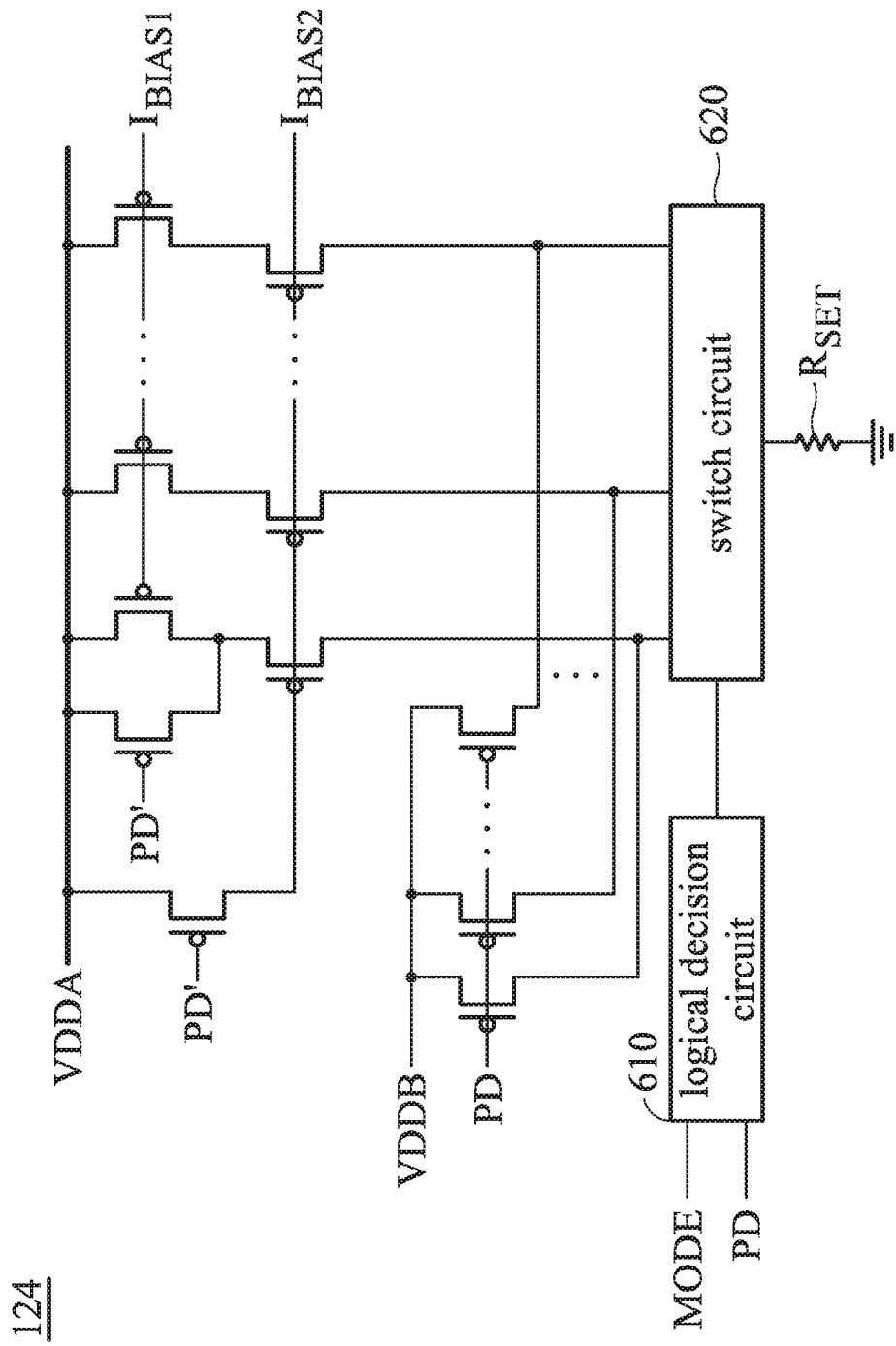
FIG. 6 is a schematic diagram of the current source setting circuit 124 according to an embodiment of the invention.

FIG. 6 is a schematic diagram of the current source setting circuit 124 according to an embodiment of the invention. As shown in FIG. 6, when the DAC 100 works in a normal working state, the current source setting circuit 124 may control the DAC 100 to work in a TV mode or in a CRT mode according to the mode selecting signal MODE input from the logical decision circuit 610. The current source setting circuit 124 may control different numbers of mirror current sources coupled to the resistor $R_{SET}$ according to different selected modes by the switch circuit 620 to generate different proportions of mirror current and different output voltages corresponding to the TV mode or CRT mode.

In an embodiment of the invention, the current source setting circuit 124 may be configured to set a first offset voltage $I_{BIAS1}$ and a second offset voltage $I_{BIAS2}$. In an embodiment of the invention, the current source setting circuit 124 is configured to set multiple offset voltages $I_{BIAS}$. When the DAC 100 works in the power down state, the current source setting circuit 124 may turn off all circuits coupled with the switch circuit 620 according to the power down signal PD which is input from the logical decision circuit 610. In addition, when DAC 100 works in the power down state, the current source setting circuit 124 increases the first offset voltage $I_{BIAS1}$ and the second offset voltage $I_{BIAS2}$ to the power-source voltage VDDA and increase the internal node voltages of the current source setting circuit 124 to the normal power-source voltage VDDB to protect the elements of the high-voltage tolerance circuit 120. In FIG. 6, the current source setting circuit 124 increases the internal node voltages to the normal power-source voltage VDDB according to the power down signal PD and increases the first offset voltage $I_{BIAS1}$ and the second offset voltage $I_{BIAS2}$ to the power-source voltage VDDA according to the output signal PD'.

In an embodiment of the invention, the high-voltage tolerance circuit 120 further includes an electrostatic discharge (ESD) device (not shown in figures) to increase protection from static electric shock.

The high-voltage tolerance circuit 120 of the invention can be applied in the (video) DAC designed for the 28-nanometer (nm) manufacturing process. Because the reference voltage $V_{REF}$ of the high-voltage tolerance circuit 120 is directly proportional to the power-source voltage VDDA, when the power-source voltage is changed to 1.8V-2.5V, the clamping voltage of each circuit of the DAC will be changed along with the changes of the power-source voltage guaranteeing that the DAC can work normally in certain voltage ranges (i.e. 1.8V-2.5V). Therefore, for a (video) DAC that is designed for the 28-nanometer (nm) manufacturing process and has a high-voltage tolerance circuit 120, when the DAC works in the TV mode, the DAC can work normally with a power-source voltage of 1.8V-2.5V. In addition, when the DAC is switched to work in the CRT mode, the high-voltage tolerance circuit 120 can work normally with a power-source voltage of 1.8V. Therefore, in the product test, a suitable power-source voltage will be able to be selected according to the test results and power consumption requirements.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Reference throughout this specification to "one embodiment" or "an embodiment" means that a particular feature, structure, or characteristic described in connection with the embodiment is included in at least one embodiment of the invention, but does not denote that they are present in every embodiment. Thus, the appearance of the phrases "in one embodiment" or "in an embodiment" in various places throughout this specification are not necessarily referring to the same embodiment of the invention.

The above paragraphs describe many aspects of the invention. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A digital-to-analog converter, comprising:
   a high-voltage tolerance circuit, configured to generate a reference voltage and select the reference voltage or a first power-source voltage to control a node voltage of each branch of an operational amplifier circuit of the high-voltage tolerance circuit according a logical signal level of an input signal,
   wherein the high-voltage tolerance circuit comprises a first transistor and the high-voltage tolerance circuit generates the reference voltage according to a second power-source voltage and a gate-to-source voltage of the first transistor.

2. The digital-to-analog converter of claim 1, wherein the high-voltage tolerance circuit comprises a voltage level transferring circuit which is configured to transfer the voltage level of the input signal.

3. The digital-to-analog converter of claim 2, wherein the voltage level transferring circuit is configured to transfer the voltage level of the input signal by a clamping circuit to ensure that a high-voltage level of the input signal is transferred to a second power-source voltage and a low voltage level of the input signal is transferred to the reference voltage, and wherein the second power-source voltage is greater than or equal to the first power-source voltage.

4. The digital-to-analog converter of claim 1, wherein the high-voltage tolerance circuit comprises a current source setting circuit which is configured to control the digital-to-analog converter to work in a TV mode or a CRT mode according to a mode selecting signal.

5. The digital-to-analog converter of claim 4, wherein in a normal working state, the current source setting circuit controls the digital-to-analog converter to work in the TV mode or the CRT mode according to the mode selecting signal, and generates a different output voltage corresponding to the TV mode or the CRT mode according to the selected mode.

6. The digital-to-analog converter of claim 4, wherein the current source setting circuit is configured to set at least one offset voltage, wherein in a power down state, the current source setting circuit increases the offset voltage to a second power-source voltage and increases internal node voltages of the current source setting circuit to the first power-source voltage, wherein the second power-source voltage is greater than or equal to the first power-source voltage.

7. The digital-to-analog converter of claim 1, wherein the second power-source voltage is greater than or equal to the first power-source voltage.

8. The digital-to-analog converter of claim 1, wherein in a normal working state, the high-voltage tolerance circuit turns on a second transistor, and clamps a source voltage of the second transistor to a first voltage.

9. The digital-to-analog converter of claim 8, wherein the first voltage is a difference of the reference voltage and a gate-to-source voltage of the second transistor.

10. The digital-to-analog converter of claim 1, wherein in a power down state, the high-voltage tolerance circuit turns on a third transistor, and increases the node voltage of each branch of the operational amplifier circuit to the first power-source voltage.

11. A high-voltage tolerance circuit, wherein the high-voltage tolerance circuit is comprised in a digital-to-analog converter, and the high-voltage tolerance circuit comprises:
   a clamping reference voltage generating circuit, configured to generate a reference voltage; and
   an operational amplifier circuit, comprising a first clamping circuit, and selecting the reference voltage or a first power-source voltage to control a node voltage of each branch of the operational amplifier circuit according a logical signal level of an input signal by the first clamping circuit,
   wherein the clamping reference voltage generating circuit comprises a first transistor and the clamping reference voltage generating circuit generates the reference voltage according to a second power-source voltage and a gate-to-source voltage of the first transistor.

12. The high-voltage tolerance circuit of claim 11, further comprising:
   a voltage level transferring circuit, configured to transfer the voltage level of the input signal.

13. The high-voltage tolerance circuit of claim 12, wherein the voltage level transferring circuit comprises a second clamping circuit, wherein the second clamping circuit is configured to transfer the voltage level of the input signal to ensure a high-voltage level of the input signal is transferred to a second power-source voltage and a low voltage level of the input signal is transferred to the reference voltage, and wherein the second power-source voltage is greater than or equal to the first power-source voltage.

14. The high-voltage tolerance circuit of claim 11, further comprising:
   a current source setting circuit, configured to control the digital-to-analog converter to work in a TV mode or a CRT mode according to a mode selecting signal.

15. The high-voltage tolerance circuit of claim 14, wherein in a normal working state, the current source setting circuit controls the digital-to-analog converter to work in the TV mode or the CRT mode according to the mode selecting signal, and generates a different output voltage corresponding to the TV mode or the CRT mode according to the selected mode.

16. The high-voltage tolerance circuit of claim 14, wherein the current source setting circuit is configured to set at least one offset voltage, wherein in a power down state, the current source setting circuit increases the offset voltage to a second power-source voltage and increases the internal node voltages of the current source setting circuit to the first power-source voltage, wherein the second power-source voltage is greater than or equal to the first power-source voltage.

17. The high-voltage tolerance circuit of claim 11, wherein the second power-source voltage is greater than or equal to the first power-source voltage.

18. The high-voltage tolerance circuit of claim 11, wherein in a normal working state, the operational amplifier circuit turns on a second transistor of the first clamping circuit, and clamps a source voltage of the second transistor to a first voltage.

19. The high-voltage tolerance circuit of claim 18, wherein the first voltage is the difference of the reference voltage and a gate-to-source voltage of the second transistor.

20. The high-voltage tolerance circuit of claim 11, wherein in a power down state, the operational amplifier circuit turns on a third transistor of the first clamping circuit, and increases the node voltage of each branch of the operational amplifier circuit to the first power-source voltage.

* * * * *